United States Patent
Wu et al.

(10) Patent No.: US 10,873,256 B1
(45) Date of Patent: Dec. 22, 2020

(54) CHARGE-PUMP BOOSTING CIRCUIT

(71) Applicant: REALTEK SEMICONDUCTOR CORP., Hsinchu (TW)

(72) Inventors: Chien-Ming Wu, Hsinchu (TW); Shih-Hsiung Huang, Hsinchu (TW); Liang-Huan Lei, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/580,111

(22) Filed: Sep. 24, 2019

(30) Foreign Application Priority Data

Jun. 24, 2019 (TW) .............................. 108122025 A

(51) Int. Cl.
*H02M 3/07* (2006.01)
(52) U.S. Cl.
CPC ..................... *H02M 3/07* (2013.01)
(58) Field of Classification Search
None
See application file for complete search history.

(56) References Cited

U.S. PATENT DOCUMENTS

| 4,438,346 A * | 3/1984 | Chuang | G11C 11/4074 327/536 |
| 8,593,840 B2 * | 11/2013 | Shionoiri | H02M 3/073 363/60 |
| 2006/0256592 A1 * | 11/2006 | Yoshida | H02M 3/073 363/59 |
| 2008/0158926 A1 * | 7/2008 | Umeda | G06K 19/0701 363/127 |
| 2011/0242865 A1 * | 10/2011 | Robbins | H02S 40/32 363/127 |
| 2012/0187932 A1 | 7/2012 | Singnurkar | |

(Continued)

FOREIGN PATENT DOCUMENTS

| CN | 104795990 A | 7/2015 |
| TW | 201332290 A1 | 8/2013 |
| WO | WO 2004/066478 A1 | 8/2004 |

OTHER PUBLICATIONS

Cho et al., "A 10 b, 20 Msample/s, 35 mW Pipeline A/D Converter", IEEE Journal of Solid-State Circuits, vol. 30, No. 3, Mar. 1995, p. 166-172.

*Primary Examiner* — Lincoln D Donovan
*Assistant Examiner* — Khareem E Almo
(74) *Attorney, Agent, or Firm* — Birch, Stewart, Kolasch & Birch, LLP

(57) ABSTRACT

A charge-pump boosting is provided. A first resistor is connected to a first storage capacitor and receives a reference voltage, and a second resistor is connected to a second storage capacitor and receives the reference voltage. A first rectifying device is connected to the first storage capacitor and a voltage output. A first clock signal and the reference voltage are used to charge the first storage capacitor, and the first clock signal is used to selectively turn on the first rectifying device to charge the voltage output by the first storage capacitor. The second rectifying device is connected to the second storage capacitor and the voltage output. A second clock signal and the reference voltage are used to charge the second storage capacitor, and the second clock signal is used to selectively turn on the second rectifying device to charge the voltage output by the second storage capacitor.

10 Claims, 7 Drawing Sheets

(56) References Cited

U.S. PATENT DOCUMENTS

| | | | | |
|---|---|---|---|---|
| 2012/0262224 | A1* | 10/2012 | Shao | H02M 3/073 327/536 |
| 2013/0343109 | A1* | 12/2013 | Bogner | H02M 7/06 363/126 |
| 2014/0268964 | A1* | 9/2014 | Xia | H02M 7/25 363/127 |
| 2016/0065059 | A1* | 3/2016 | Ikenaga | H01L 29/00 363/60 |
| 2016/0099638 | A1* | 4/2016 | Ersoy | H04R 19/04 381/113 |

* cited by examiner

US 10,873,256 B1

CHARGE-PUMP BOOSTING CIRCUIT

CROSS-REFERENCE TO RELATED APPLICATION

This non-provisional application claims priority under 35 U.S.C. § 119(a) to patent application Ser. No. 10/812,2025 in Taiwan, R.O.C. on Jun. 24, 2019, the entire contents of which are hereby incorporated by reference.

BACKGROUND

Technical Field

The present invention relates to a voltage conversion technology, and in particular, to a charge-pump boosting circuit.

Related Art

As an integrated circuit process evolves, a power supply voltage (VDD) is increasingly lower, but a turn-on threshold voltage (Vth) of a metal oxide semiconductor (MOS) element is not greatly reduced. Therefore, in an advanced process, the MOS element is likely to be difficult to turn on and a value of a resistance within the element is likely to be excessively large. In addition, in order to enable a chip to consume low energy and occupy a small area, a growing number of high and low voltage elements are used in combination. As a result, a bias condition of the MOS elements in a circuit is unfavorable for turning on the MOS.

In order to resolve the foregoing problem, a charge-pump circuit is used to convert an input voltage into a voltage required for an element, to supply a voltage required for each of high and low voltage elements. The charge-pump boosting circuit is used as an example. In an existing charge-pump boosting circuit, many switch elements, such as a metal-oxide-semiconductor field-effect transistor (MOS FET) element are used, to boost a voltage to a linear combination of supply voltages. However, using more switching elements results in an excessively complex circuit and is not suitable for all circuits.

SUMMARY

In view of this, the present invention proposes a charge-pump boosting circuit, including two storage capacitors, two resistors, and two rectifying devices. One end of a first storage capacitor receives a first clock signal, and the other end is connected to a first node. One end of a second storage capacitor receives a second clock signal, and the other end is connected to a second node. A first resistor is respectively connected to the first node and a reference voltage, and a second resistor is respectively connected to the second node and the reference voltage. A first rectifying device is connected to the first node and a voltage output. The first clock signal and the reference voltage that passes through the first resistor are used to charge the first storage capacitor, and the first clock signal is used to selectively turn on the first rectifying device to charge the voltage output by the first storage capacitor. A second rectifying device is connected to the second node and the voltage output. The second clock signal and the reference voltage that passes through the second resistor are used to charge the second storage capacitor, and the second clock signal is used to selectively turn on the second rectifying device to charge the voltage output by the second storage capacitor.

In some embodiments, the first clock signal and the second clock signal are clock signals in opposite directions, and are used to charge the voltage output by the first storage capacitor and the second storage capacitor in turn.

In some embodiments, when the first clock signal is at a high-level voltage, the first rectifying device is turned on and the voltage output is charged by the first storage capacitor. When the second clock signal is at the high-level voltage, the second rectifying device is turned on and the voltage output is charged by the second storage capacitor.

In some embodiments, an output voltage of the voltage output is obtained by subtracting a threshold voltage of the first rectifying device or the second rectifying device from a sum of the high-level voltage and the reference voltage.

In some embodiments, the first rectifying device and the second rectifying device are P-channel metal-oxide-semiconductor (PMOS) field-effect transistors, N-channel metal-oxide-semiconductor (NMOS) field-effect transistors, or diodes.

In some embodiments, when the first rectifying device is a first P-channel metal-oxide-semiconductor field-effect transistor, a source of the first P-channel metal-oxide-semiconductor field-effect transistor is connected to the first node, and a gate and a drain are both connected to the voltage output. When the second rectifying device is a second P-channel metal-oxide-semiconductor field-effect transistor, a source of the second P-channel metal-oxide-semiconductor field-effect transistor is connected to the second node, and a gate and a drain are both connected to the voltage output.

In some embodiments, when the first rectifying device is a first N-channel metal-oxide-semiconductor field-effect transistor, a source of the first N-channel metal-oxide-semiconductor field-effect transistor is connected to the voltage output, and a gate and a drain are both connected to the first node. When the second rectifying device is the second N-channel metal-oxide-semiconductor field-effect transistor, a source of the second N-channel metal-oxide-semiconductor field-effect transistor is connected to the voltage output, and a gate and a drain are both connected to the second node.

In some embodiments, when the first rectifying device is a first diode, a positive electrode of the first diode is connected to the first node, and a negative electrode of the first diode is connected to the voltage output. When the second rectifying device is a second diode, a positive electrode of the second diode is connected to the second node, and a negative electrode of the second diode is connected to the voltage output.

In summary, in the present invention, relatively few elements are used to boost a voltage, and a boosted output voltage is determined according to a threshold voltage of the rectifying device, so that the output voltage can be used to effectively turn on a transistor element that requires a high voltage to be turned on in a circuit.

DETAILED DESCRIPTION

Figure 1:
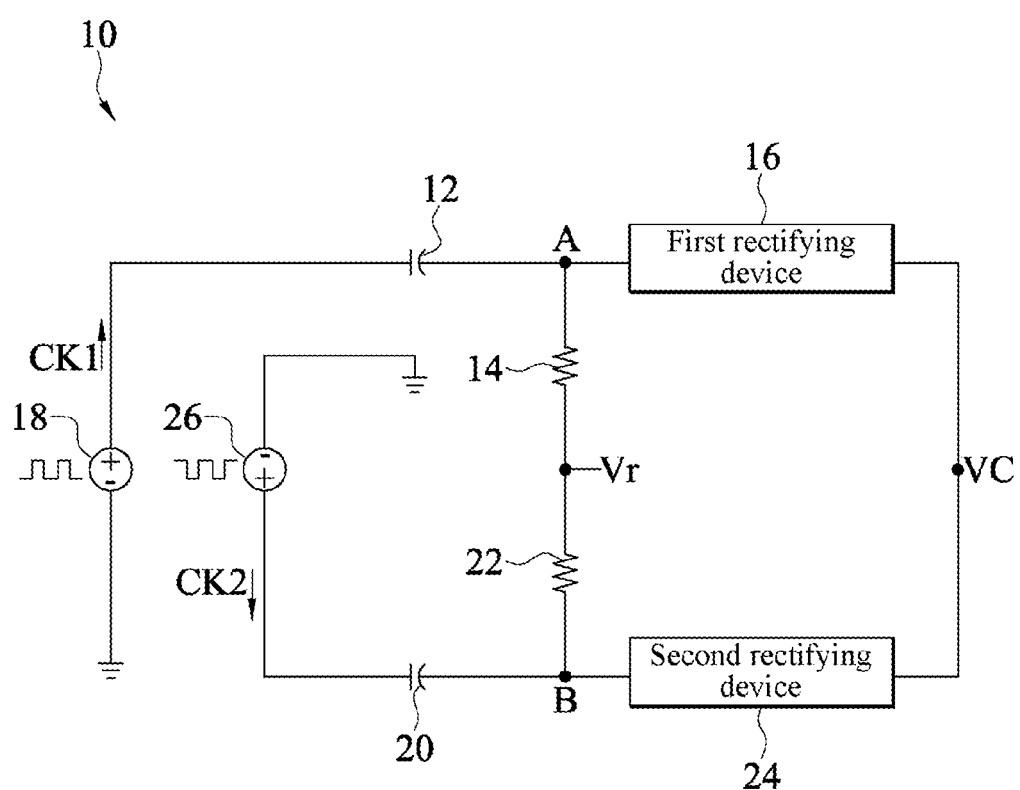
FIG. 1 is a schematic circuit diagram of a charge-pump boosting circuit according to an embodiment of the present invention.

FIG. 1 is a schematic circuit diagram of a charge-pump boosting circuit according to an embodiment of the present invention. Referring to FIG. 1, the charge-pump boosting circuit 10 includes a first storage capacitor 12, a first resistor 14, a first rectifying device 16, a second storage capacitor 20, a second resistor 22, a second rectifying device 24, and a power output VC.

In the charge-pump boosting circuit 10, one end of the first storage capacitor 12 is electrically connected to a first clock source 18 to receive a first clock signal CK1, and the other end of the first storage capacitor 12 is electrically connected to a first node A. One end of the second storage capacitor 20 is electrically connected to a second clock source 26 to receive a second clock signal CK2, and the other end of the second storage capacitor 20 is electrically connected to a second node B. Two ends of the first resistor 14 are respectively connected to the first node A and a reference voltage Vr, so that the first resistor 14 is electrically connected to the first storage capacitor 12 through the first node A. Two ends of the second resistor 22 are respectively connected to the second node B and the reference voltage Vr, so that the second resistor 22 is electrically connected to the second storage capacitor 20 through the second node B. The first rectifying device 16 is electrically connected to the first node A and a voltage output VC respectively, so that the first clock signal CK1 and the reference voltage Vr that passes through the first resistor 14 are used to charge the first storage capacitor 12, and the first clock signal CK1 is used to selectively turn on the first rectifying device 16 to charge the voltage output VC by the first storage capacitor 12. The second rectifying device 24 is electrically connected to the second node B and the voltage output VC respectively, so that the second clock signal CK2 and the reference voltage Vr that passes through the second resistor 22 may be used to charge the second storage capacitor 20, and the second clock signal CK2 is used to selectively turn on the second rectifying device 24 to charge the voltage output VC by the second storage capacitor 20.

The first clock signal CK1 generated by the first clock source 18 and the second clock signal CK2 generated by the second clock source 26 are clock signals in opposite directions. When the first clock signal CK1 is at a high-level voltage, the first rectifying device 16 is turned on and the voltage output VC is charged by the first storage capacitor 12. In turn, when the second clock signal CK2 generated by the second clock source 26 is at a high-level voltage, the second rectifying device 24 is turned on and the voltage output VC is charged by the second storage capacitor 20, so that the voltage output VC is charged by the first storage capacitor 12 and the second storage capacitor 20 in turn. Therefore, the voltage output VC is repeatedly charged by the first storage capacitor 12 and the second storage capacitor 20, so that an output voltage Vo of the voltage output VC gradually rises to a predetermined voltage value, and the voltage value can be maintained.

In an embodiment, the first rectifying device 16 and the second rectifying device 24 are P-channel metal-oxide-semiconductor (PMOS) field-effect transistors. Referring to both FIG. 1 and FIG. 2, the first rectifying device 16 is a first P-channel metal-oxide-semiconductor field-effect transistor 161, and the second rectifying device 24 is a second P-channel metal-oxide-semiconductor field-effect transistor 241, both the first P-channel metal-oxide-semiconductor field-effect transistor 161 and the second P-channel metal-oxide-semiconductor field-effect transistor 241 being diode-connect transistors. In particular, a source of the first P-channel metal-oxide-semiconductor field-effect transistor 161 is connected to the first node A, and a gate of the first P-channel metal-oxide-semiconductor field-effect transistor 161 is connected to a drain, the gate and the drain being both connected to the voltage output VC. A source of the second P-channel metal-oxide-semiconductor field-effect transistor 241 is connected to the second node B, and a gate of the second P-channel metal-oxide-semiconductor field-effect transistor 241 is connected to a drain, the gate and the drain being both connected to the voltage output VC.

Figure 2:
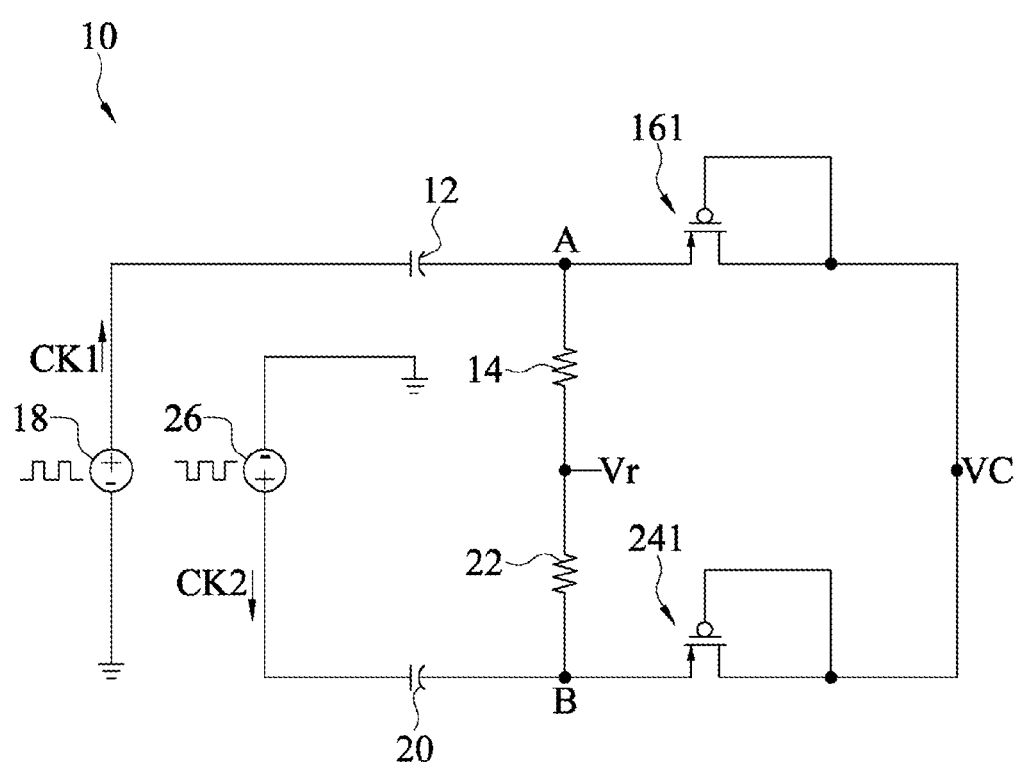
FIG. 2 is a circuit diagram of a charge-pump boosting circuit with a PMOS according to an embodiment of the present invention.
Figure 3:
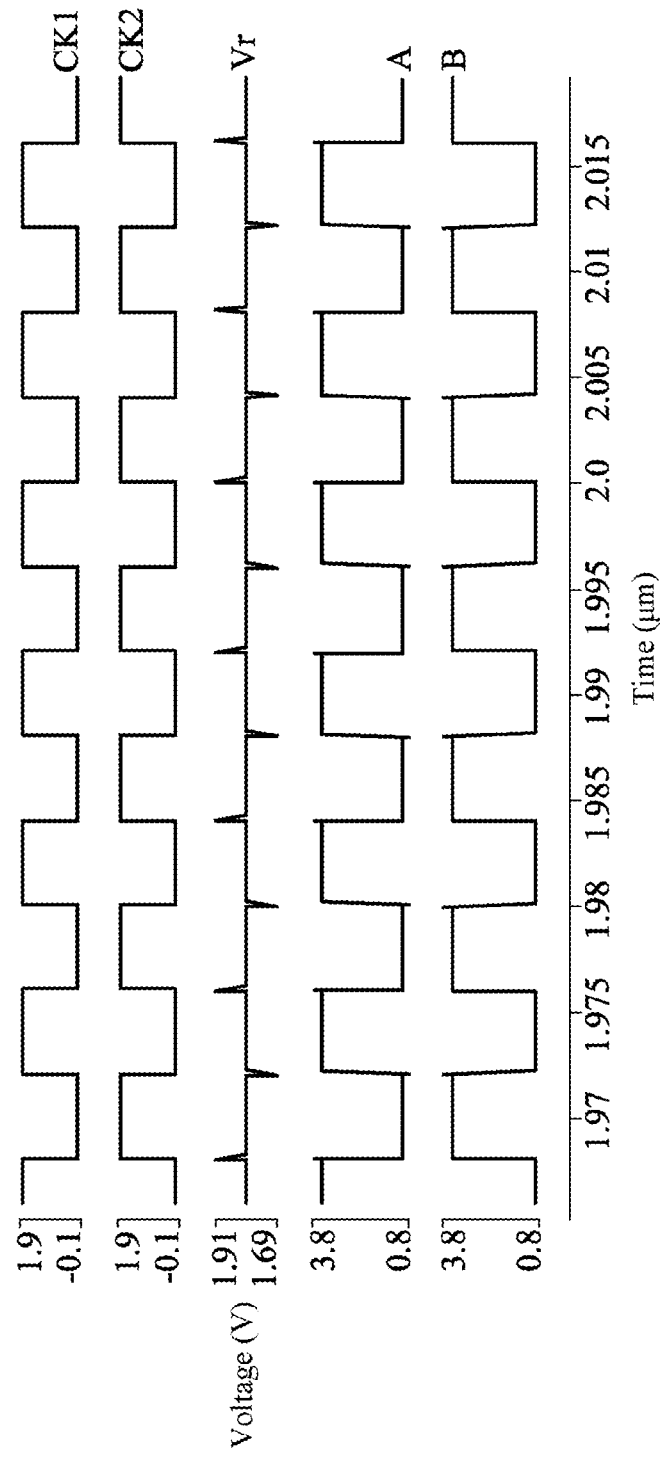
FIG. 3 is a schematic waveform diagram of a charge-pump boosting circuit with a PMOS according to an embodiment of the present invention.

Referring to both FIG. 2 and FIG. 3, when the first clock signal CK1 output by the first clock source 18 is at a high-level voltage, the first clock signal CK1 and the reference voltage Vr are used to charge the first storage capacitor 12, a potential of the first node A is also at a high-level voltage, and the first clock signal CK1 at a high-level voltage is used to turn on the first P-channel metal-oxide-semiconductor field-effect transistor 161 to charge the voltage output VC by the first storage capacitor 12. In this case, the second clock signal CK2 output by the second clock source 26 is at a low-level voltage, a potential of the second node B is also at a low-level voltage, and the second P-channel metal-oxide-semiconductor field-effect transistor 241 is in a disconnected (turn-off) state. Therefore, the second storage capacitor 20 cannot charge the voltage output VC. On the contrary, when the second clock signal CK2 output by the second clock source 26 is at a high-level voltage, the second clock signal CK2 and the reference voltage Vr are used to charge the second storage capacitor 20, the potential of the second node B is also at a high-level voltage, and the second clock signal CK2 at a high-level voltage is used to turn on the second P-channel metal-oxide-semiconductor field-effect transistor 241 to charge the voltage output VC by the second storage capacitor 20. In this case, the first clock signal CK1 output by the first clock source 18 is at a low-level voltage, the potential of the first node A is also at a low-level voltage, and the first P-channel metal-oxide-semiconductor field-effect transistor 161 is in a disconnected (turn-off) state. Therefore, the first storage capacitor 12 cannot charge the voltage output VC. In this way, the first clock source 18 outputs the first clock signal CK1 at a high-level voltage and the second clock source 26 outputs the second clock signal CK2 at a high-level voltage in turn, so that the first storage capacitor 12 and the second storage capacitor 20 repeatedly charge the voltage output VC in turn. Therefore, the output voltage Vo of the voltage output VC gradually rises until a predetermined voltage value is stably maintained.

The output voltage Vo of the voltage output VC is obtained by subtracting a threshold voltage Vth1 (Vo=CK1+Vr−Vth1) of the first P-channel metal-oxide-semiconductor field-effect transistor 161 from a sum of the high-level voltage of the first clock signal CK1 and the reference voltage Vr, or by subtracting a threshold voltage Vth2 (Vo=CK2+Vr−Vth2) of the second P-channel metal-oxide-semiconductor field-effect transistor 241 from a sum of the high-level voltage of the second clock signal CK2 and the reference voltage Vr. Therefore, the output voltage Vo of the voltage output VC is not simply a voltage across the first storage capacitor 12 or the second storage capacitor 20, but is determined based on the threshold voltage Vth1 of the first P-channel metal-oxide-semiconductor field-effect transistor 161 or the threshold voltage Vth2 of the second P-channel metal-oxide-semiconductor field-effect transistor 241.

Figure 4:
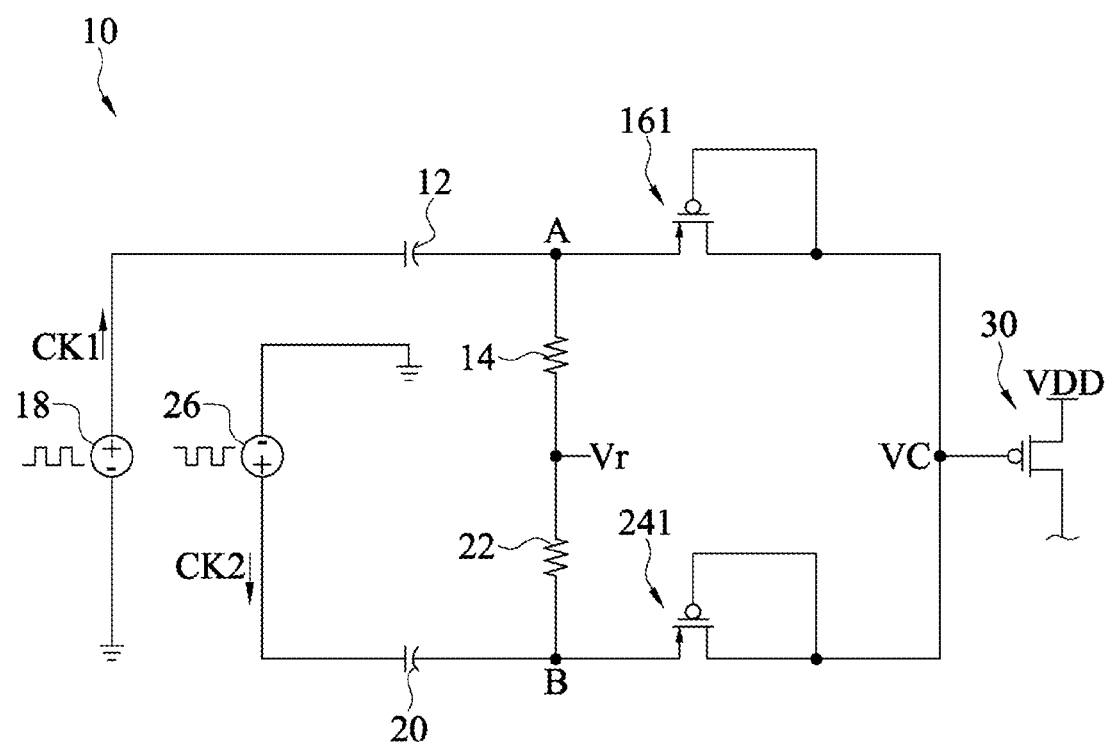
FIG. 4 is a schematic circuit diagram of a connection between a charge-pump boosting circuit of FIG. 2 and a high voltage transistor.

In an embodiment, frequencies of the first clock signal CK1 and the second clock signal CK2 are 25 MHz, capacitances of the first storage capacitor 12 and the second storage capacitor 20 are 100 F, resistances of the first resistor 14 and the second resistor 22 are 1.1 MΩ, the threshold voltage Vth1 of the first P-channel metal-oxide-semiconductor field-effect transistor 161 and the threshold value Vth2 of the second P-channel metal-oxide-semiconductor field-effect transistor 241 are 0.81 V-1.1 V (which vary according to a process, a voltage, or a temperature), the high-level voltages of the first clock signal CK1 and the second clock signal CK2 are 1.8 V, and the reference voltage Vr is 1.8 V. Due to an influence of the threshold voltages Vth1, Vth2, the output voltage Vo of the voltage output VC is 2.5 V-2.79 V (from 1.8+1.8-0.81 V-1.1 V), instead of a value twice of 1.8 V. However, a value of the output voltage Vo can be used to turn on a transistor element that requires a high voltage to be turned on in a circuit. As shown in FIG. 4, the voltage output VC is electrically connected to a gate of a third P-channel metal-oxide-semiconductor field-effect transistor 30. Because the first P-channel metal-oxide-semiconductor field-effect transistor 161, the second P-channel metal-oxide-semiconductor field-effect transistor 241, and the third P-channel metal-oxide-semiconductor field-effect transistor 30 are fabricated using a same process, variability of the first P-channel metal-oxide-semiconductor field-effect transistor 161 and the second P-channel metal-oxide-semiconductor field-effect transistor 241 is similar to that of the back-end third P-channel metal-oxide-semiconductor field-effect transistor 30. Therefore, the output voltage VC can be used to turn on the third P-channel metal-oxide-semiconductor field-effect transistor 30 smoothly through voltage biasing, to make the circuit operate smoothly subsequently.

Figure 5:
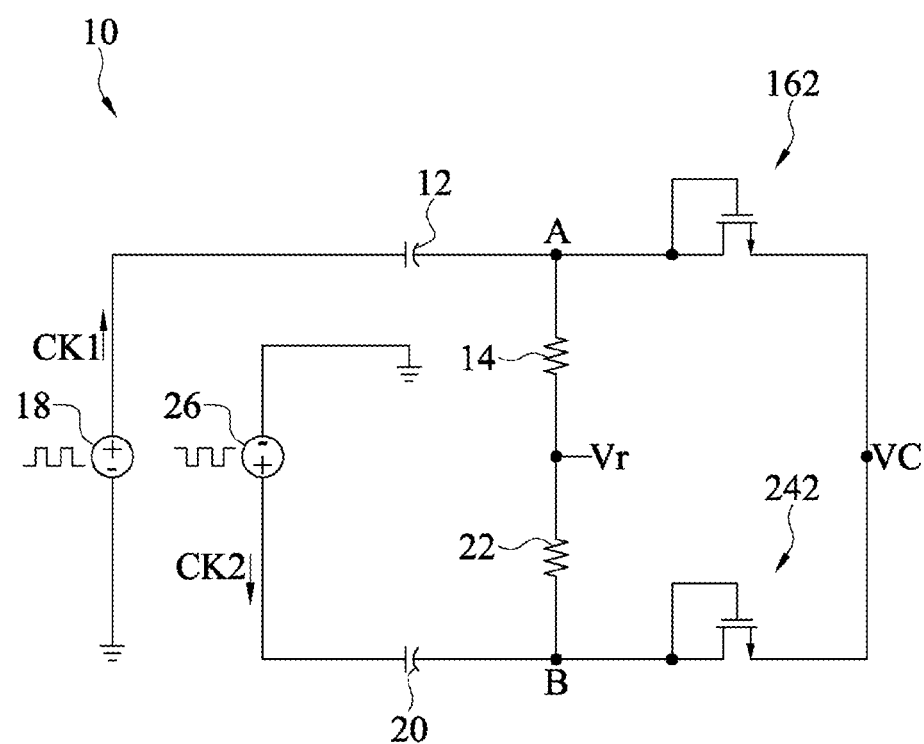
FIG. 5 is a circuit diagram of a charge-pump boosting circuit with an NMOS according to an embodiment of the present invention.

In an embodiment, the first rectifying device 16 and the second rectifying device 24 are N-channel metal-oxide-semiconductor (NMOS) field-effect transistors. Referring to FIG. 1 and FIG. 5, the first rectifying device 16 is a first N-channel metal-oxide-semiconductor field-effect transistor 162, and the second rectifying device 24 is a second N-channel metal-oxide-semiconductor field-effect transistor 242, both the first N-channel metal-oxide-semiconductor field-effect transistor 162 and the second N-channel metal-oxide-semiconductor field-effect transistor 242 being diode-connect transistors. A source of the first N-channel metal-oxide-semiconductor field-effect transistor 162 is connected to the voltage output VC, and a gate of the first N-channel metal-oxide-semiconductor field-effect transistor 162 is connected to a drain, the gate and the drain being both connected to the first node A. A source of the second N-channel metal-oxide-semiconductor field-effect transistor 242 is connected to the voltage output VC, and a gate of the first N-channel metal-oxide-semiconductor field-effect transistor 242 is connected to a drain, the gate and the drain being both connected to the second node B.

When the first clock signal CK1 output by the first clock source 18 is at a high-level voltage, the first clock signal CK1 and the reference voltage Vr are used to charge the first storage capacitor 12, and the first clock signal CK1 at a high-level voltage is used to turn on the first N-channel metal-oxide-semiconductor field-effect transistor 162 to charge the voltage output VC by the first storage capacitor 12. When the second clock signal CK2 output by the second clock source 26 is at a high-level voltage, the second clock signal CK2 and the reference voltage Vr are used to charge the second storage capacitor 20, and the second clock signal CK2 at a high-level voltage is used to turn on the second N-channel metal-oxide-semiconductor field-effect transistor 242 to charge the voltage output VC by the second storage capacitor 20. In this way, the first clock source 18 outputs the first clock signal CK1 at a high-level voltage and the second clock source 26 outputs the second clock signal CK2 at a high-level voltage in turn, so that the first storage capacitor 12 and the second storage capacitor 20 repeatedly charge the voltage output VC in turn. Therefore, the output voltage Vo of the voltage output VC gradually rises until a predetermined voltage value is stably maintained. In this embodiment, except that the first N-channel metal-oxide-semiconductor field-effect transistor 162 and the second N-channel metal-oxide-semiconductor field-effect transistor 242 are used as rectifying devices in the charge-pump boosting circuit 10, other details are the same as those of the embodiment shown in FIG. 1, and thus are not described herein again.

Figure 6:
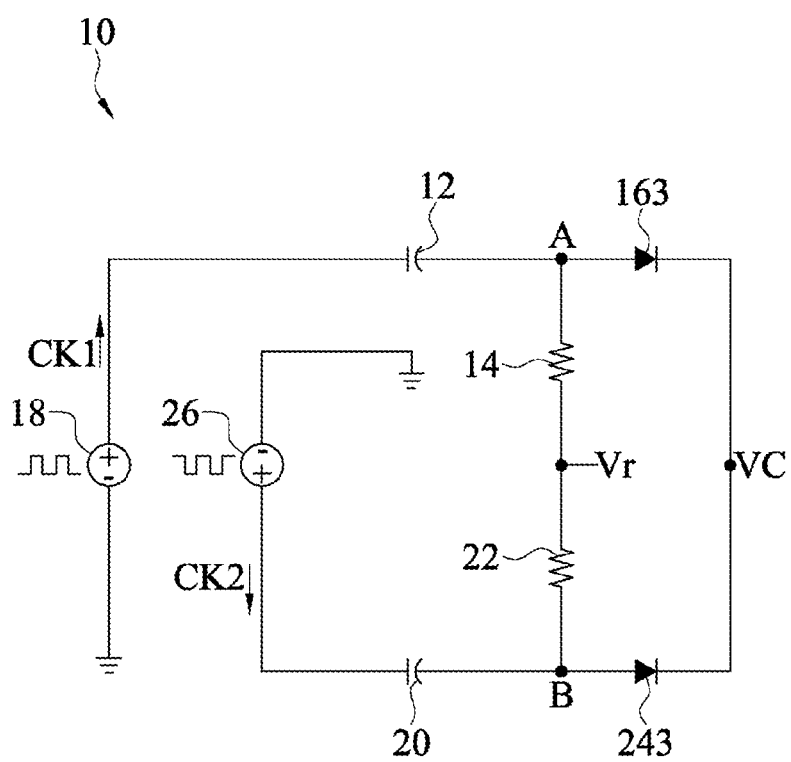
FIG. 6 is a circuit diagram of a charge-pump boosting circuit with a diode according to an embodiment of the present invention.

In an embodiment, the first rectifying device 16 and the second rectifying device 24 are diodes. Referring to FIG. 1 and FIG. 6, a positive electrode of a first diode 163 is connected to the first node A, and a negative electrode of the first diode 163 is connected to the voltage output VC. A positive electrode of the second diode 243 is connected to the second node B, and a negative electrode of the second diode 243 is connected to the voltage output VC. When the first clock signal CK1 is at a high-level voltage, the first clock signal CK1 and the reference voltage Vr are used to charge the first storage capacitor 12, and the first clock signal CK1 at a high-level voltage is used to turn on a first diode 163 to charge the voltage output VC by the first storage capacitor 12. When the second clock signal CK2 is at a high-level voltage, the second clock signal CK2 and the reference voltage Vr are used to charge the second storage capacitor 20, and the second clock signal CK2 at a high-level voltage is used to turn on the second diode 243 to charge the voltage output VC by the second storage capacitor 20. Therefore, the voltage output VC is repeatedly charged by the first storage capacitor 12 and the second storage capacitor 20 in turn, so that the output voltage Vo of the voltage output VC gradually rises until a predetermined voltage value is stably maintained. In this embodiment, except that the first diode 163 and the second diode 243 are used as rectifying devices in the charge-pump boosting circuit 10, other details are the same as those of the embodiment shown in FIG. 1, and thus are not described herein again.

Figure 7:
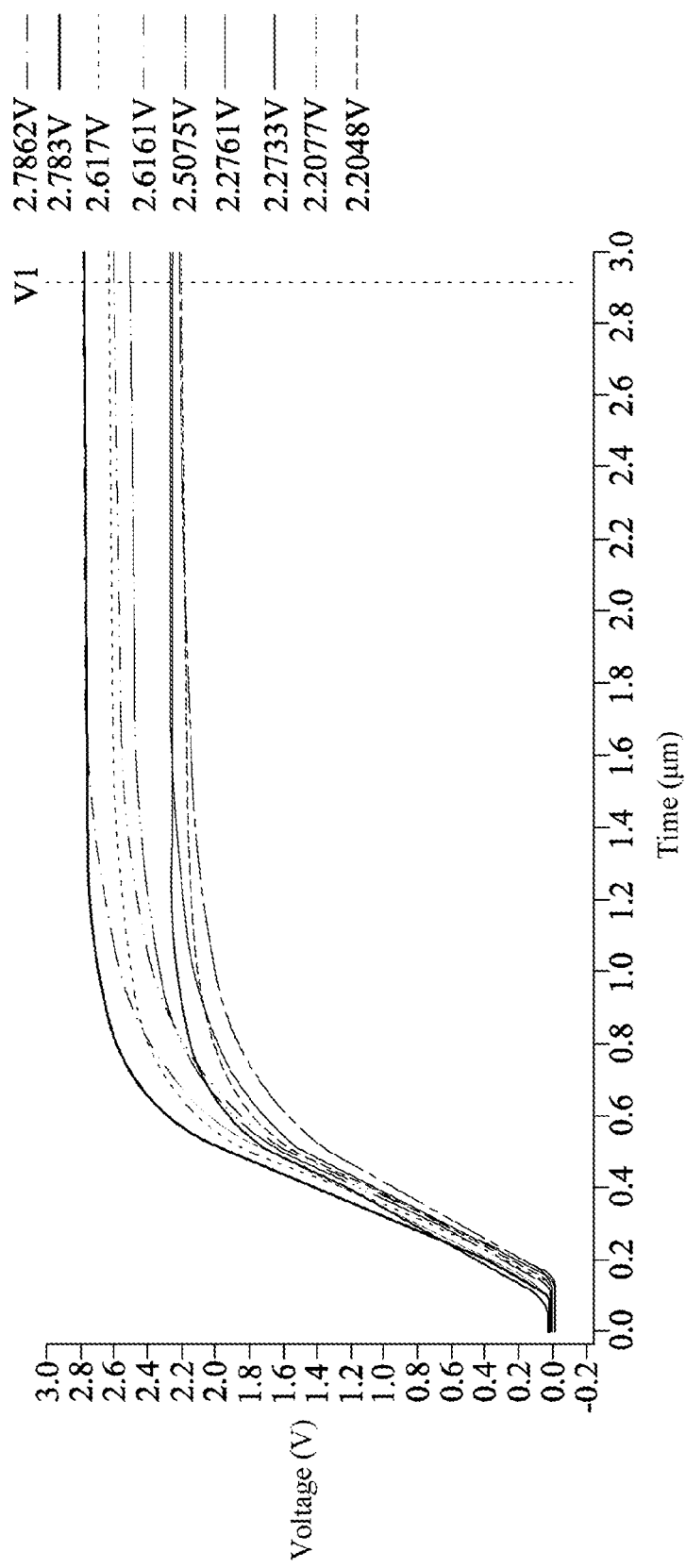
FIG. 7 is a schematic waveform diagram of an output voltage of a voltage output according to an embodiment of the present invention.

Referring to FIG. 7, a schematic waveform diagram of an output voltage of a voltage output of a charge-pump boosting circuit under different processes, voltages and temperatures is shown. Although the output voltage of the voltage output varies (2.2 V-2.79 V), each waveform gradually rises from zero at the beginning and then gradually tends to be stable. This is because the first storage capacitor and the second storage capacitor repeatedly charge the voltage output in turn. Therefore, the output voltage gradually rises from zero until a predetermined voltage value is stably maintained. Therefore, although the circuit has variability such as a process, a voltage, or a temperature, the charge-pump boosting circuit can still provide a stable output voltage.

In summary, the present invention proposes a charge-pump boosting circuit with a simple circuit architecture, to boost a voltage using relatively few elements. A boosted output voltage is determined according to the threshold voltage of the rectifying devices (the first rectifying device and the second rectifying device), so that the output voltage can be used to effectively turn on a transistor element that requires a high voltage to be turned on in a circuit.

The foregoing embodiments are merely for stating the technical ideas and the characteristics of the present invention, and are intended to enable those skilled in the art to understand and hereby implement the content of the present disclosure. However, scope of claims of the present invention is not limited thereto. In other words, equivalent changes or modifications made according to the spirit disclosed in the present invention shall still fall into the scope of the claims of the present invention.

What is claimed is:

1. A charge-pump boosting circuit, comprising:
   a first storage capacitor, one end of the first storage capacitor receiving a first clock signal, and the other end being connected to a first node;
   a second storage capacitor, one end of the second storage capacitor receiving a second clock signal, and the other end being connected to a second node;
   a first resistor respectively connected to the first node and a reference voltage;
   a second resistor respectively connected to the second node and the reference voltage;
   a first rectifying device connected to the first node and a voltage output, wherein the reference voltage passing through the first resistor and the first clock signal are used to charge the first storage capacitor, and the first clock signal being used to selectively turn on the first rectifying device to charge the voltage output by the first storage capacitor; and
   a second rectifying device connected to the second node and the voltage output, wherein the reference voltage passing through the second resistor and the second clock signal are used to charge the second storage capacitor, and the second clock signal being used to selectively turn on the second rectifying device to charge the voltage output by the second storage capacitor.

2. The charge-pump boosting circuit according to claim 1, wherein the first clock signal and the second clock signal are clock signals in opposite directions, and are used to charge the voltage output by the first storage capacitor and the second storage capacitor in turn.

3. The charge-pump boosting circuit according to claim 2, wherein when the first clock signal is at a high-level voltage, the first rectifying device is turned on and the voltage output is charged by the first storage capacitor; and when the second clock signal is at the high-level voltage, the second rectifying device is turned on and the voltage output is charged by the second storage capacitor.

4. The charge-pump boosting circuit according to claim 3, wherein an output voltage of the voltage output is obtained by subtracting a threshold voltage of the first rectifying device or the second rectifying device from a sum of the high-level voltage and the reference voltage.

5. The charge-pump boosting circuit according to claim 1, wherein the first rectifying device and the second rectifying device are P-channel metal-oxide-semiconductor (PMOS) field-effect transistors.

6. The charge-pump boosting circuit according to claim 5, wherein the first rectifying device is a first P-channel metal-oxide-semiconductor field-effect transistor, a source of the first P-channel metal-oxide-semiconductor field-effect transistor being connected to the first node, a gate and a drain being both connected to the voltage output; and the second rectifying device is a second P-channel metal-oxide-semiconductor field-effect transistor, a source of the second P-channel metal-oxide-semiconductor field-effect transistor being connected to the second node, and a gate and a drain being both connected to the voltage output.

7. The charge-pump boosting circuit according to claim 1, wherein the first rectifying device and the second rectifying device are N-channel metal-oxide-semiconductor (NMOS) field-effect transistors.

8. The charge-pump boosting circuit according to claim 7, wherein the first rectifying device is a first N-channel metal-oxide-semiconductor field-effect transistor, a source of the first N-channel metal-oxide-semiconductor field-effect transistor being connected to the voltage output, and a gate and a drain being both connected to first node; and the second rectifying device is a second N-channel metal-oxide-semiconductor field-effect transistor, a source of the second N-channel metal-oxide-semiconductor field-effect transistor being connected to the voltage output, and a gate and a drain being both connected to the second node.

9. The charge-pump boosting circuit according to claim 1, wherein the first rectifying device and the second rectifying device are diodes.

10. The charge-pump boosting circuit according to claim 9, wherein the first rectifying device is a first diode, a positive electrode of the first diode being connected to the first node, and a negative electrode being connected to the voltage output; and the second rectifying device is a second diode, a positive electrode of the second diode being connected to the second node, and a negative electrode being connected to the voltage output.

* * * * *